(12) United States Patent
Saito et al.

(10) Patent No.: US 11,256,116 B2
(45) Date of Patent: Feb. 22, 2022

(54) LIGHT ISOLATOR MEMBER AND LIGHT ISOLATOR

(71) Applicant: Enplas Corporation, Saitama (JP)

(72) Inventors: Yuki Saito, Saitama (JP); Ayano Kon, Saitama (JP)

(73) Assignee: ENPLAS CORPORATION, Saitama (JP)

( * ) Notice: Subject to any disclaimer, the term of this patent is extended or adjusted under 35 U.S.C. 154(b) by 1 day.

(21) Appl. No.: 16/987,439

(22) Filed: Aug. 7, 2020

(65) Prior Publication Data
US 2021/0041728 A1    Feb. 11, 2021

(30) Foreign Application Priority Data

Aug. 9, 2019   (JP) .............................. JP2019-147704

(51) Int. Cl.
*G02F 1/095* (2006.01)
*G02B 6/42* (2006.01)
*H01S 5/00* (2006.01)

(52) U.S. Cl.
CPC .......... *G02F 1/0955* (2013.01); *G02B 6/4206* (2013.01); *G02B 6/4209* (2013.01); *H01S 5/0064* (2013.01)

(58) Field of Classification Search
CPC ... G02F 1/0955; G02B 6/4206; G02B 6/4209; G02B 6/403; G02B 6/2746; G02B 6/3825; H01S 5/0064
See application file for complete search history.

(56) References Cited

U.S. PATENT DOCUMENTS 6,599,023 B2 *  7/2003  Yu ........................ G02B 6/2746
                                                    385/34
8,279,542 B2 * 10/2012  Tanaka ................. G02B 6/2937
                                                    359/819

FOREIGN PATENT DOCUMENTS

JP         2011-069875 A      4/2011

* cited by examiner

*Primary Examiner* — John Bedtelyon
(74) *Attorney, Agent, or Firm* — Brundidge & Stanger, P.C.

(57) ABSTRACT

A light isolator member of an embodiment of the present invention is configured to be joined to another light isolator member to serve as a part of a light isolator, the light isolator member including: a lens surface disposed in a first surface; a transmission surface disposed at a position corresponding to the lens surface in a second surface on a side opposite to the first surface; and a fitting part disposed in the second surface, the fitting part being configured for fitting to the other light isolator member.

10 Claims, 11 Drawing Sheets

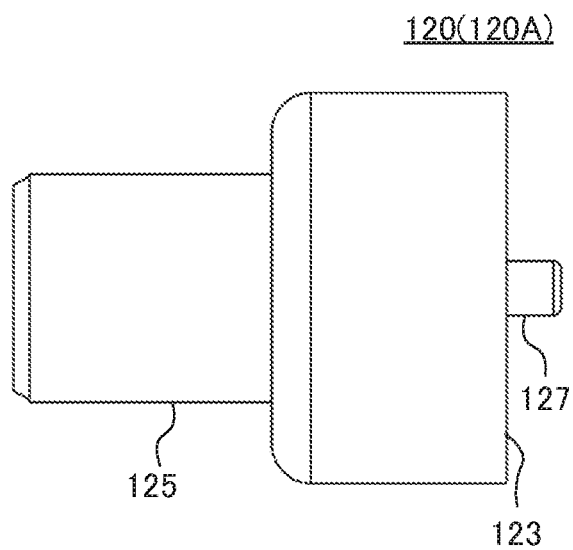
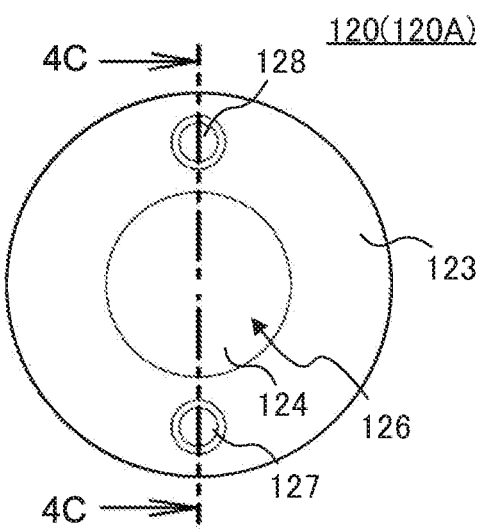
FIG. 4A
FIG. 4B
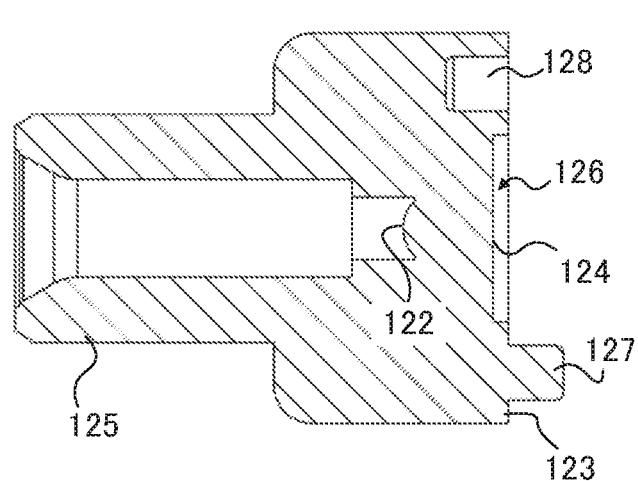
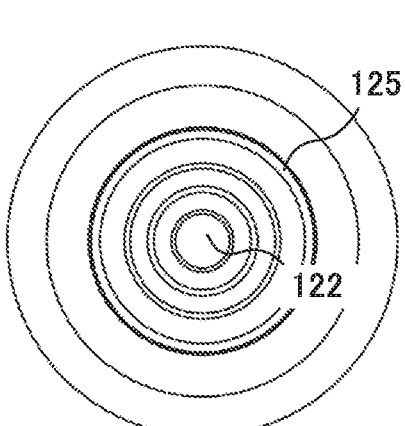
FIG. 4C
FIG. 4D

LIGHT ISOLATOR MEMBER AND LIGHT ISOLATOR

CROSS REFERENCE TO RELATED APPLICATIONS

This application is entitled to and claims the benefit of Japanese Patent Application No. 2019-147704, filed on Aug. 9, 2019, the disclosure of which including the specification, drawings and abstract is incorporated herein by reference in its entirety.

TECHNICAL FIELD

The present invention relates to a light isolator member and a light isolator.

BACKGROUND ART

A laser device such as a semiconductor laser is used for optical communications using an optical transmission member such as an optical fiber and a light waveguide. In such a laser device, when light reflected by an optical surface or a processed surface disposed outside a laser resonator is returned, laser oscillation tends to become unstable, and may be resulted in signal noise in optical communications. Therefore, to prevent returning of reflected return light to the laser device, a light isolator including a Faraday rotator and a polarization light separating element is used, for example.

FIG. 1 is a schematic view illustrating light isolator 20 disclosed in PTL 1. As illustrated in FIG. 1, light isolator 20 includes a first optical fiber collimator including polarization maintenance optical fiber 1, collimator lens 3, and collimator lens holder 5, a second optical fiber collimator including polarization maintenance optical fiber 2, collimator lens 4 and collimator lens holder 6, and diffraction grating type polarizer 8, Faraday rotator 11 (sapphire substrate 14/garnet film 13/sapphire substrate 14) and light detector 10 disposed therebetween. In addition, light isolator 20 further includes shield plate 7 disposed between collimator lens 1 and diffraction grating type polarizer 8 of the first optical fiber collimator.

To assemble such a light isolator 20, it is necessary to accurately align the optical axis between polarization maintenance optical fiber 1 (or 2) and collimator lens 3 (or 4), for example.

CITATION LIST

Patent Literature

PTL 1
Japanese Patent Application Laid-Open No. 2011-69875

SUMMARY OF INVENTION

Technical Problem

However, a known light isolator as disclosed in PTL 1 has a large number of components, and as such is difficult to assemble with accurate alignment of the components.

In view of this, an object of the present invention is to provide a light isolator member and a light isolator using the light isolator member which can reduce the number of components, and can be assembled with accurate alignment of the components.

Solution to Problem

The present invention relates to a light isolator member and a light isolator described below.

A light isolator member of an embodiment of the present invention is configured to be joined to another light isolator member to serve as a part of a light isolator, the light isolator member including: a lens surface disposed in a first surface; a transmission surface disposed at a position corresponding to the lens surface in a second surface on a side opposite to the first surface; and a fitting part disposed in the second surface, the fitting part being configured for fitting to the other light isolator member.

A light isolator of an embodiment of the present invention is includes: a first light isolator member; a second light isolator member; and an optical device disposed between the first light isolator member and the second light isolator member, wherein each of the first light isolator member and the second light isolator member is the light isolator member, and wherein the fitting part of the first light isolator member and the fitting part of the second light isolator member are fitted with each other.

Advantageous Effects of Invention

According to the present invention, it is possible to provide a light isolator member and a light isolator using the light isolator member which can reduce the number of components, and can be assembled with accurate alignment of the components.

BRIEF DESCRIPTION OF DRAWINGS

FIGS. 4A to 4D illustrate a configuration of a light isolator member according to Embodiment 1.

DESCRIPTION OF EMBODIMENTS

An embodiment of the present invention is elaborated below with reference to the accompanying drawings.

Embodiment 1

Figure 1:
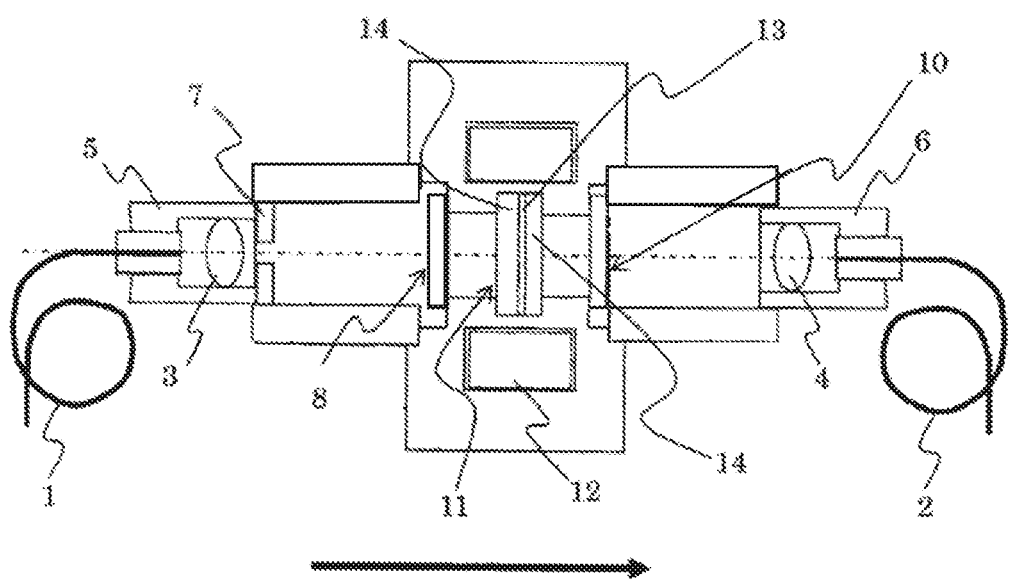
FIG. 1 is a perspective view illustrating a configuration of a light isolator disclosed in PTL 1.
Figure 2:
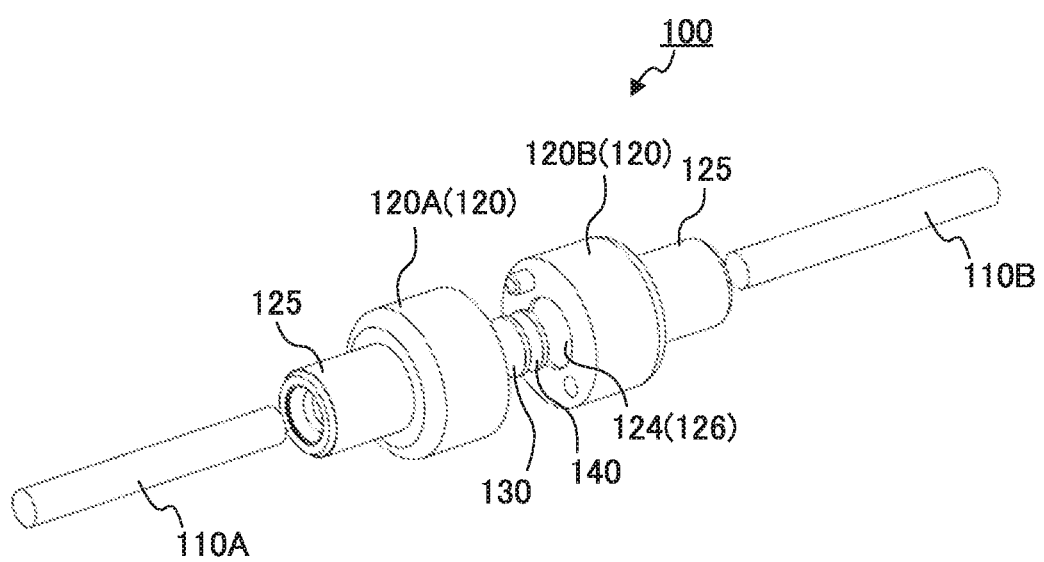
FIG. 2 illustrates a configuration of an exploded perspective view of a light isolator according to Embodiment 1.
Figure 3A:
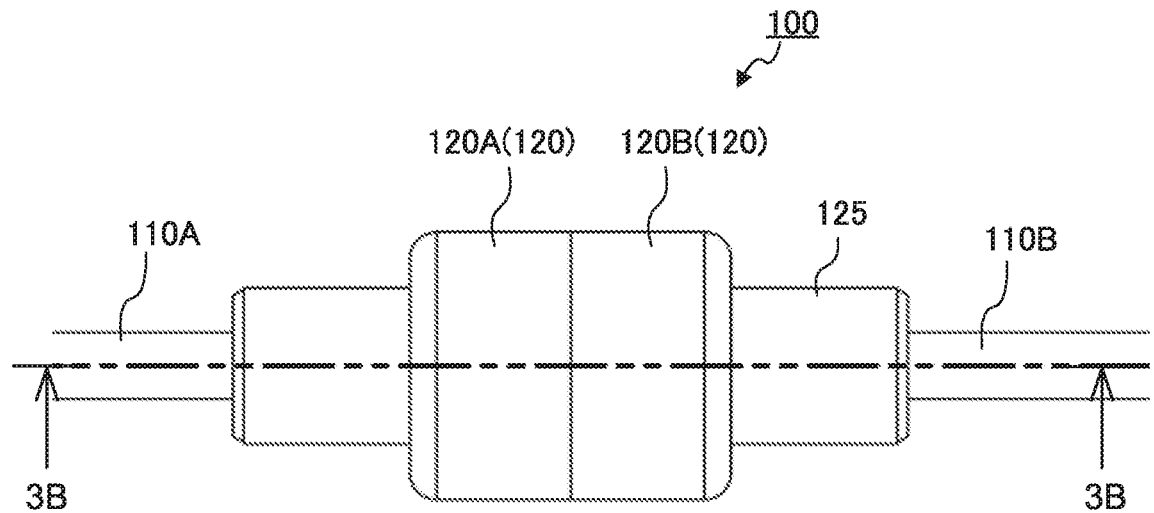
FIG. 3A is a plan view of the light isolator of FIG. 2.
Figure 3B:
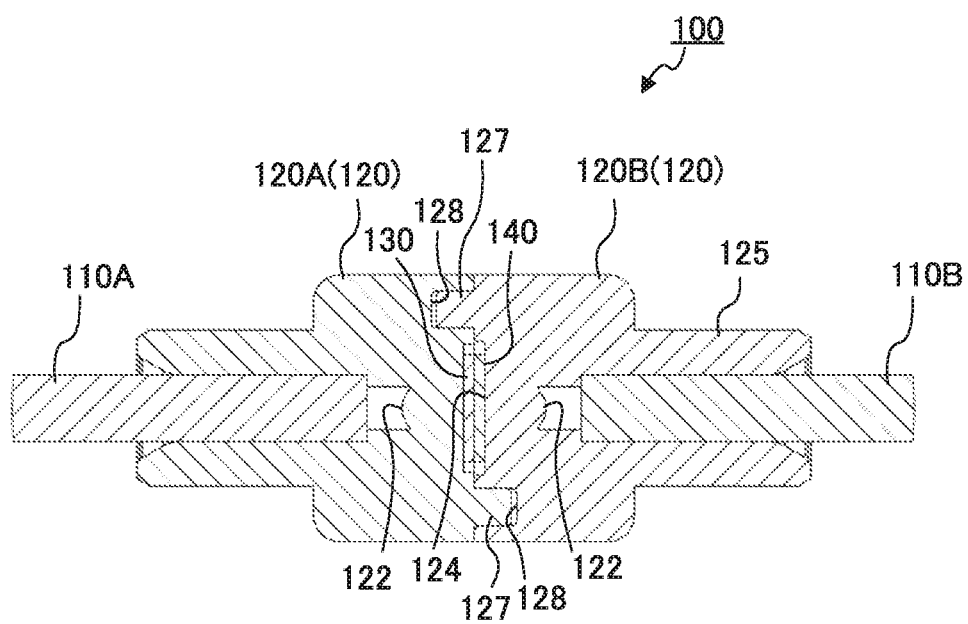
FIG. 3B is a sectional view of the light isolator of FIG. 3A taken along line 3B-3B.

Configuration of Light Isolator
FIGS. 2, 3A and 3B illustrate a configuration of light isolator 100 according to the present embodiment. FIG. 2 is an exploded perspective view illustrating a configuration of light isolator 100. FIG. 3A is a plan view of light isolator 100, and FIG. 3B is a sectional view of light isolator 100 taken along line 3B-3B. Note that these drawings illustrate an exemplary application of light isolator 100 in which two optical transmission members (optical transmission member 110A and optical transmission member 110B) are connected to each other with light isolator 100 therebetween.

As illustrated in FIGS. 2, 3A and 3B, light isolator 100 is disposed and used between optical transmission member 110A on one side and optical transmission member 110B on the other side.

The type of optical transmission members 110A and 110B is not limited, and may be an optical fiber, a light waveguide or the like. In the present embodiment, optical transmission members 110A and 110B are optical fibers. Optical transmission members 110A and 110B may be of a single mode type, or a multiple mode type. In the present embodiment, optical transmission members 110A and 110B are optical fibers of a single mode type. Note that the optical fiber may be a polarization fiber or an unpolarization fiber. In the present embodiment, the optical fiber is an unpolarization fiber.

Light isolator 100 includes first light isolator member 120A, second light isolator member 120B, and polarizer 130 and rotator 140 (which are optical devices) disposed between the light isolator members.

When combined with an optical device, first light isolator member 120A and second light isolator member 120B serve as isolators. As described later, first light isolator member 120A and second light isolator member 120B are joined to each other by fitting fitting part 127 (or fitting part 128) of first light isolator member 120A and fitting part 128 (or fitting part 127) of second light isolator member 120B to each other.

First light isolator member 120A and second light isolator member 120B may have the same shape, or different shapes. In view of reduction in the number of metal molds used for manufacturing, reduction in manufacturing cost and the like, first light isolator member 120A and second light isolator member 120B preferably have the same shape as described in the present embodiment.

First light isolator member 120A and second light isolator member 120B are formed of a material that is optically transparent to light of a wavelength used in optical communications, for example. Examples of such a material include transparent resins such as polyetherimide (PEI) and cyclic olefin resin. In addition, first light isolator member 120A and second light isolator member 120B are produced by injection molding, for example.

The configurations of first light isolator member 120A and second light isolator member 120B will be elaborated later.

The optical device is not limited as long as the function as a light isolator can be achieved, and may be one member or a combination of two or more members. In the present embodiment, the optical device is polarizer 130 and rotator 140.

Polarizer 130 is a device that converts incident light into linear polarized light, and may be a polarizer of a diffraction grating type, for example.

Rotator 140 is a device that converts, into circularly-polarized light, light (linear polarized light) passed through polarizer 130, and may be a Faraday rotator or a quarter-wave plate, for example. The Faraday rotator includes a Faraday device and a magnetic field provider (e.g., a magnet) that provides a magnetic field to the Faraday device. The Faraday device may be a single-crystal film of Bi-substituted rare earth iron garnet, for example. Such a Faraday rotator rotates the polarization direction of light when a magnetic field is applied thereto.

Configuration of Light Isolator Member

In the present embodiment, first light isolator member 120A and second light isolator member 120B have the same shape, and therefore first light isolator member 120A (light isolator member 120) is described below.

Figure 5:
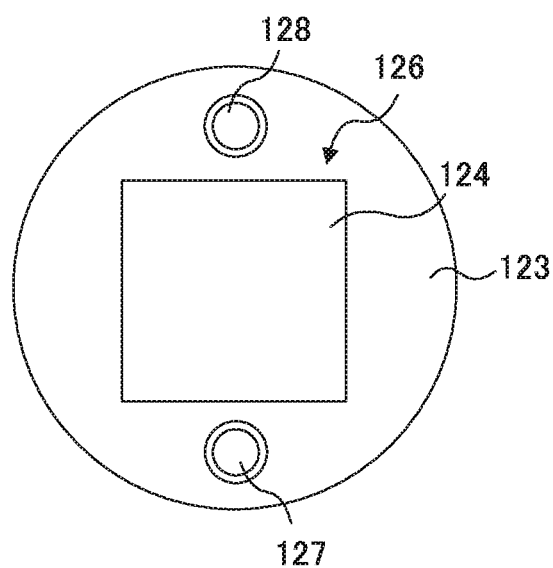
FIG. 5 is a right side view illustrating a modification of a fixing part of the light isolator member.

FIGS. 4A to 4D illustrate a configuration of light isolator member 120 (120A) according to the present embodiment. FIG. 4A is a plan view of light isolator member 120 (120A), FIG. 4B is a right side view of light isolator member 120 (120A), FIG. 4C is a sectional view of light isolator member 120 (120A) taken along 4C-4C of FIG. 4B, and FIG. 4D is a left side view of light isolator member 120 (120A). FIG. 5 is a right side view illustrating a modification of fixing part 126 of light isolator member 120 (120A).

As illustrated in FIGS. 4A to 4D, light isolator member 120 (120A) includes lens surface 122, transmission surface 124, positioning part 125, fixing part 126, and two fitting parts 127 and 128.

Lens surface 122 is disposed in a first surface (not illustrated in the drawing) on the side on which optical transmission member 110A is connected in light isolator member 120 (120A), and light emitted from optical transmission member 110A impinges on lens surface 122 (or light entered from transmission surface 124 is emitted toward optical transmission member 110A). Lens surface 122 is preferably a collimator lens surface.

Transmission surface 124 is disposed at a position corresponding to lens surface 122 in second surface 123 on the side on which the optical device is disposed in light isolator member 120 (120A), i.e., in second surface 123 on the side opposite to the first surface (not illustrated in the drawing). The position corresponding to lens surface 122 is a position where light incident on lens surface 122 passes (or light entered from transmission surface 124 can be emitted from lens surface 122). Transmission surface 124 allows, to pass therethrough, light entered from lens surface 122 (or allows incidence of light passed through the optical device).

Positioning part 125 is disposed on first surface 121 of light isolator member 120 (120A) for positioning optical transmission member 110A with respect to lens surface 122. The shape of positioning part 125 is not limited as long as the position of optical transmission member 110A can be set with respect to lens surface 122. For example, positioning part 125 has a cylindrical member that fits to optical transmission member 110A.

Positioning part 125 may be separated from or integral with a body of light isolator member 120 (120A) including lens surface 122, transmission surface 124 and two fitting parts 127 and 128. In the present embodiment, positioning part 125 is integrated with the body of light isolator member 120 including lens surface 122, transmission surface 124, and two fitting parts 127 and 128 (i.e., lens surface 122, transmission surface 124, two fitting parts 127 and 128 and positioning part 125 are integrated with one another).

Fixing part 126 is disposed in second surface 123 of light isolator member 120 (120A) and fixes the optical device at transmission surface 124. Fixing part 126 is not limited as long as the optical device can be fixed, and may be a recess or a frame-shaped member, for example. In the present embodiment, fixing part 126 is a recess, and the bottom surface of the recess is transmission surface 124.

The shape of the recess is not limited, and may have a columnar shape (see FIG. 4A), or a prism shape (see FIG. 5).

Two fitting parts 127 and 128 are disposed on second surface 123 of light isolator member 120 (120A), and configured for joining to the other light isolator member (in the present embodiment, second light isolator member 120B) (or for fitting to the fitting part of the other light isolator member). Two fitting parts 127 and 128 may be two protrusions, two recesses, or a combination of a protrusion and a recess. Among them, in view of reduction in manufacturing cost and the like, it is preferable that first light isolator member 120A and second light isolator member 120B have the same shape, and that fitting part 127 and fitting part 128 be a protrusion and a recess, respectively.

Specifically, in the present embodiment, it is preferable that fitting part 127 (first fitting part) be a protrusion, and that fitting part 128 (second fitting part) be a recess. Thus, the protrusion serving as fitting part 127 (first fitting part) has a shape that is complementary to the recess serving as fitting part 128 (second fitting part). More specifically, fitting parts 127 (protrusion) and 128 (recess) of first light isolator member 120A are configured to be fit to fitting parts 128 (recess) and 127 (protrusion) of second light isolator member 120B, respectively.

In addition, in the present embodiment, two fitting parts 127 and 128 are disposed at respective positions such that they are symmetric about the optical axis of light that passes through lens surface 122 and transmission surface 124. Note that the "optical axis of light that passes through lens surface 122 and transmission surface 124" is a central axis of a light flux that passes through lens surface 122 and transmission surface 124.

Operation

Figure 6A:
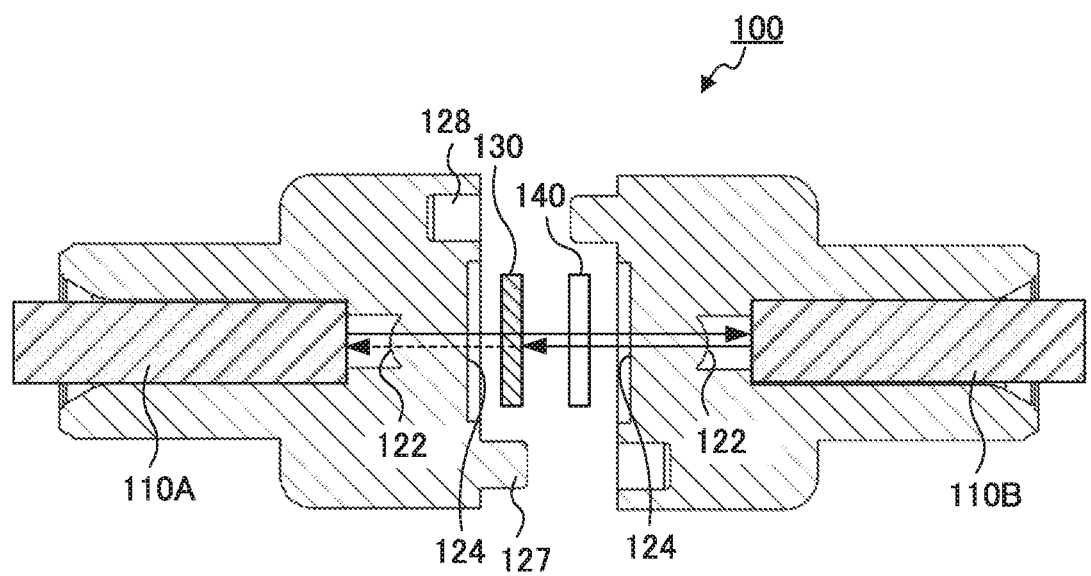
FIG. 6A illustrates light paths in the light isolator according to Embodiment 1.

An operation of light isolator 100 according to the present embodiment is described below with reference to FIGS. 6A and 6B. FIG. 6A illustrates light paths of light isolator 100 according to the present embodiment, and FIG. 6B is an explanatory diagram illustrating a state of light that passes through polarizer 130 and rotator 140 of light isolator 100 illustrated in FIG. 6A.

As illustrated in FIG. 6A, light emitted from optical transmission member 110A on one side impinges on lens surface 122 of first light isolator member 120A. Light incident on lens surface 122 is converted into collimated light, and is emitted from transmission surface 124 (see FIG. 6A).

Figure 6B:
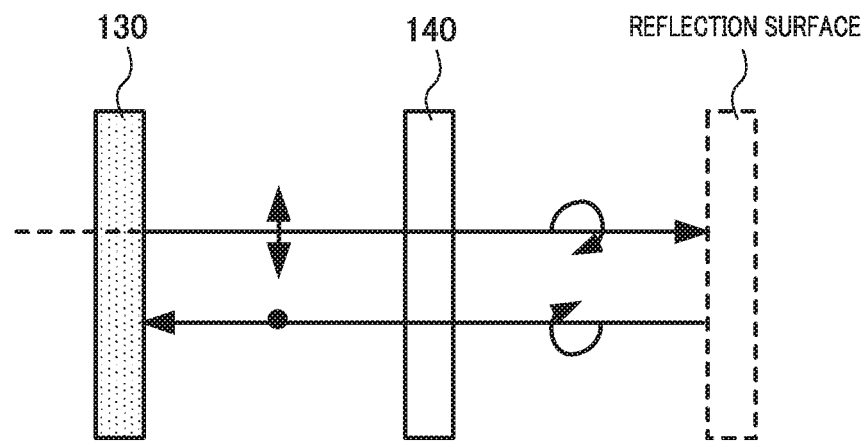
FIG. 6B is an explanatory diagram illustrating light passing through a polarizer and a rotator in the light isolator of FIG. 6A.

Light emitted from transmission surface 124 impinges on polarizer 130 and changed into linear polarized light (see FIG. 6B). The linear polarized light passed through polarizer 130 impinges on rotator 140 and is changed into right-handed circularly-polarized light (see FIG. 6B). The light changed to circularly-polarized light at rotator 140 impinges on transmission surface 124 of second light isolator member 120B, so as to be emitted from lens surface 122, and impinges on optical transmission member 110B on the other side (see FIG. 6A).

On the other hand, a part of light that impinges on optical transmission member 110B on the other side so as to be emitted from lens surface 122 may be reflected in the forward path (see FIGS. 6A and 6B). Such reflected light becomes reversed rotational circularly-polarized light and returns to the direction opposite to the forward direction (see FIG. 6B). When such return light impinges on rotator 140, the return light is changed into linear polarized light that does not pass through polarizer 130 (see FIGS. 6A and 6B). Accordingly, the linear polarized light that does not pass through polarizer 130 does not pass through transmission surface 124 of first light isolator member 120A.

In this manner, transmission of light in a given direction can be allowed while preventing transmission of light in the opposite direction, and thus a function as an isolator can be provided.

Effect

As described above, in the present embodiment, fitting part 127 (or 128) of first light isolator member 120A and fitting part 128 (or 127) of second light isolator member 120B are fitted and joined to each other. In addition, positioning part 125 for positioning optical transmission member 110A (or 110B) with respect to lens surface 122 is integrated with the body of light isolator member 120 (120A). Thus, by reducing the number of the components of light isolator 100, the ease of assembling can be increased and the components can be positioned with high accuracy.

Embodiment 2

Configuration of Light Isolator

Light isolator 100 according to Embodiment 2 differs from light isolator 100 according to Embodiment 1 in that light isolator 100 according to Embodiment 2 is of a lens array type and has a configuration for dealing with multi-channel light transmission. In the following description, the same components as those of Embodiment 1 are denoted with the same reference numerals and the description thereof will be omitted.

Figure 7:
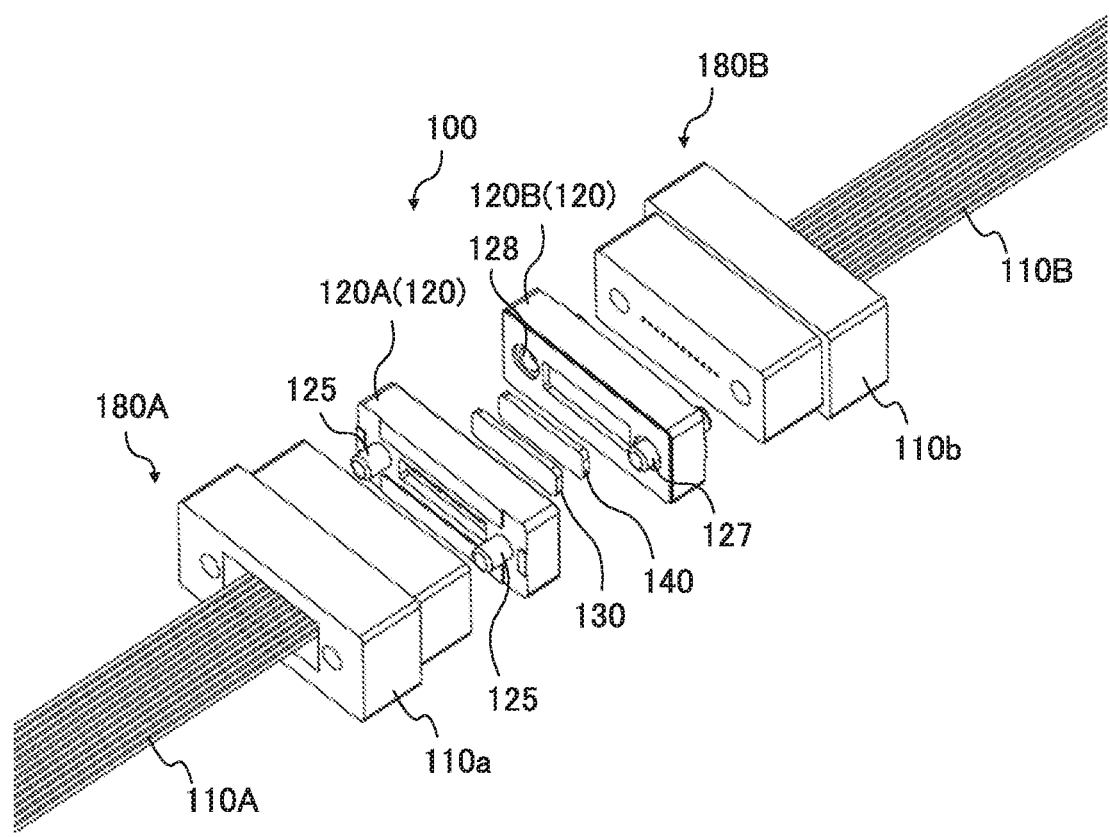
FIG. 7 is an exploded perspective view illustrating a configuration of a light isolator according to Embodiment 2.
Figure 8A:
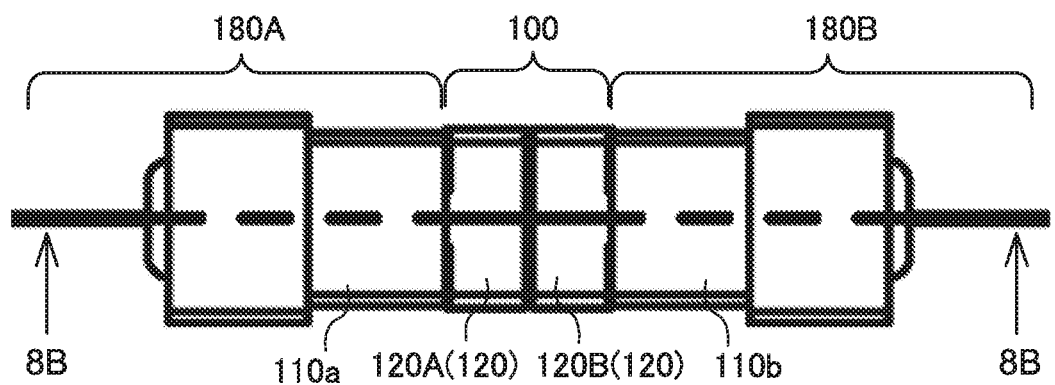
FIG. 8A is a front view of the light isolator of FIG. 7.
Figure 8B:
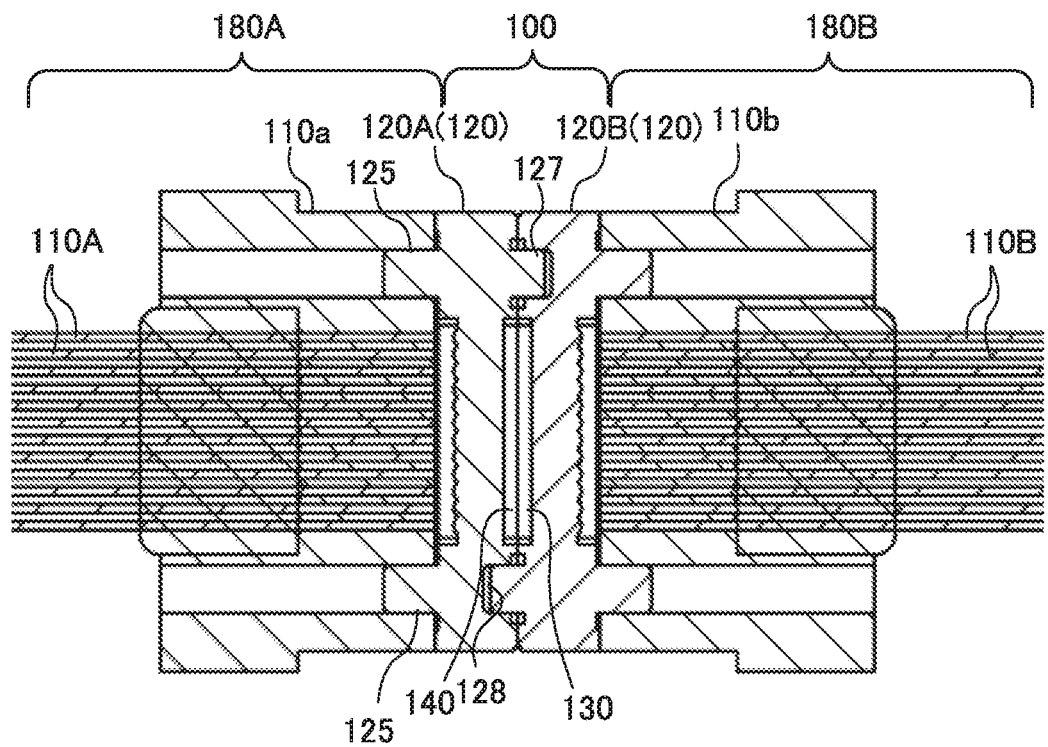
FIG. 8B is a sectional view of the light isolator of FIG. 8A taken along line 8B-8B.

FIGS. 7, 8A and 8B illustrate a configuration of light isolator 100 according to the present embodiment. FIG. 7 is an exploded perspective view illustrating a configuration of light isolator 100. FIG. 8A is a front view of light isolator 100, and FIG. 8B is a sectional view of light isolator 100 taken along line 8B-8B of FIG. 8A. Note that the drawings illustrate an exemplary application of light isolator 100 in which two batches of optical transmission members (batch 180A of optical transmission members and a batch 180B of optical transmission members) are connected to each other with light isolator 100 therebetween.

As illustrated in FIGS. 7, 8A and 8B, light isolator 100 is disposed and used between batch 180A of optical transmission members on one side and batch 180B of optical transmission members on the other side.

In batch 180A (or 180B) of optical transmission members, a plurality of optical transmission members 110A (or 110B) are attached to light isolator 100 through multicore collective connector 110a (or 110b). In the present embodiment, in batch 180A (or 180B) of optical transmission members, twelve optical transmission members 110A (or 110B) are aligned at a given interval.

Light isolator 100 includes first light isolator member 120A, second light isolator member 120B, and polarizer 130 and rotator 140 (which are optical devices) disposed between first light isolator member 120A and second light isolator member 120B.

Configuration of Light Isolator Member

Also in the present embodiment, first light isolator member 120A and second light isolator member 120B have the same shape, and therefore first light isolator member 120A (light isolator member 120) will be described, as in Embodiment 1.

Figure 9A:
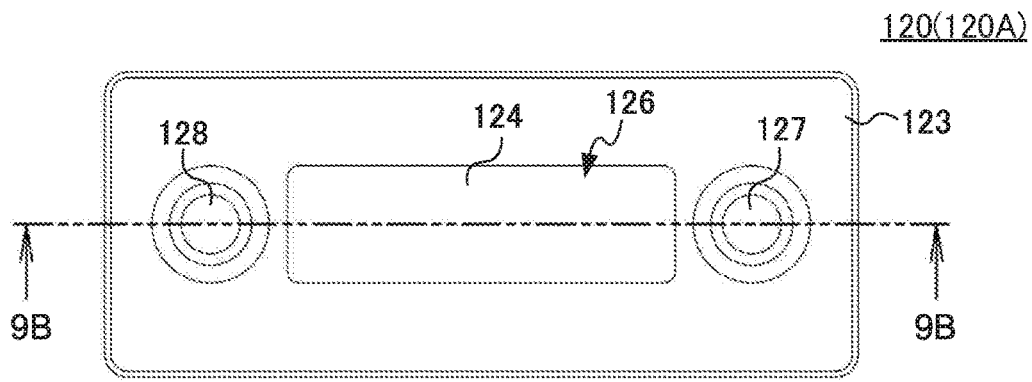
FIGS. 9A to 9D illustrate a configuration of the light isolator member according to Embodiment 2.
Figure 9B:
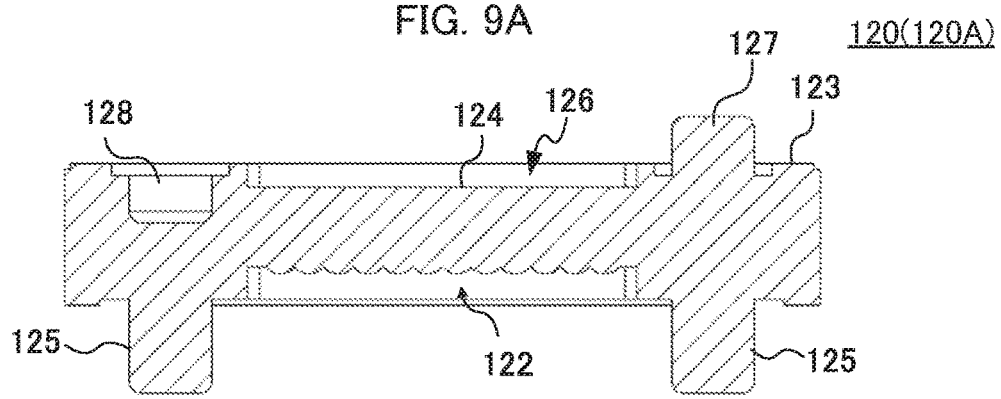
Figure 9C:
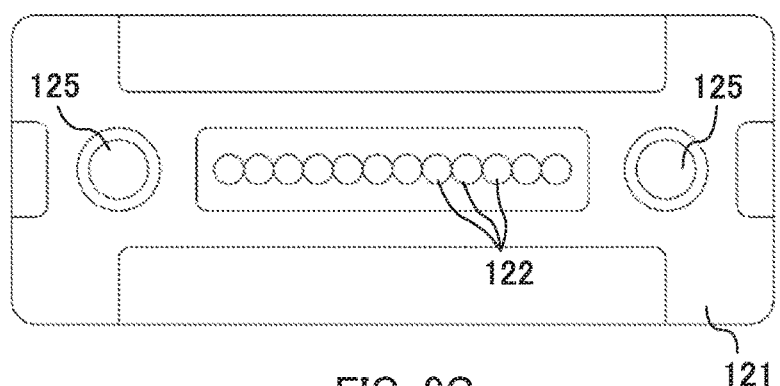
Figure 9D:
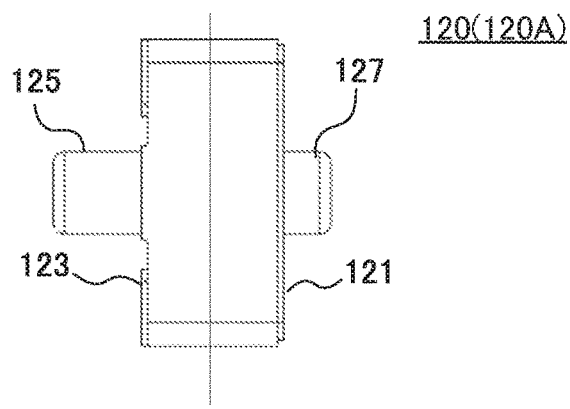

FIGS. 9A to 9D illustrate a configuration of light isolator member 120 (120A) according to the present embodiment. FIG. 9A is a right side view of light isolator member 120 (120A), FIG. 9B is a sectional view of light isolator member 120 (120A) taken along line 9B-9B of FIG. 9A, FIG. 9C is a left side view, and FIG. 9D is a front view.

As illustrated in FIGS. 9A to 9D, light isolator member 120 (120A) according to the present embodiment includes a plurality of lens surfaces 122, one transmission surface 124, positioning part 125, one fixing part 126, and two fitting parts 127 and 128. That is, in the present embodiment, twelve lens surfaces 122 corresponding to the number of optical transmission members 110A are provided.

Transmission part 124 is disposed in second surface 123 of light isolator member 120 (120A) so as to encompass the position corresponding to lens surfaces 122.

Positioning part 125 is disposed so as to be fitted with multicore collective connector 110a of optical transmission member 110A. In the present embodiment, positioning part 125 is a pair of protrusions (guides) that fit to connector 110a.

When a group of the plurality of lens surfaces 122 is assumed to be viewed as one lens surface, two fitting parts 127 and 128 are disposed at respective positions that are symmetrical about the optical axis of light that passes through transmission surface 124 and the one lens surface.

Effect

Light isolator 100 according to the present embodiment can deal with multichannel light transmission while achieving the effect of Embodiment 1.

Modifications

While first light isolator member 120A and second light isolator member 120B have the same shape in Embodiments 1 and 2, such a configuration is not limitative, and they may have different shapes.

For example, it is possible to adopt a configuration in which only one of first light isolator member 120A and second light isolator member 120B includes fixing part 126 and the other does not include fixing part 126. In addition, it is possible to adopt a configuration in which two fitting parts 127 and 128 of first light isolator member 120A are protrusions, and two fitting parts 127 and 128 of second light isolator member 120B are recesses. In addition, it is possible to adopt a configuration in which two fitting parts 127 and 128 in first light isolator member 120A may be disposed at positions that are asymmetric about the optical axis of light that passes through transmission surface 124 and lens surface 122.

In addition, while two fitting parts 127 (or 128) are provided in first light isolator member 120A (or second light isolator member 120B) in Embodiments 1 and 2, such a configuration is not limitative, and the number of fitting part 127 (or 128) may be one, or three or more.

In addition, while positioning part 125 of optical transmission member 110A is a cylindrical member (Embodiment 1) or a pair of protrusions (Embodiment 2) provided in first surface 121 of light isolator member 120 (120A) in Embodiments 1 and 2, such a configuration is not limitative. For example, positioning part 125 in light isolator member 120 (120A) may be a recess (provided first surface 121) that can be fitted with connector 110a having a positioning protrusion.

In addition, while positioning part 125 are a pair of protrusions (guides) in Embodiment 2, such a configuration is not limitative, and two or more pairs may be provided.

In addition, while a combination of polarizer 130 and rotator 140 is used as the optical device in Embodiments 1 and 2, such a configuration is not limitative, and various combinations that can function as a light isolator may be adopted.

Figure 10A:
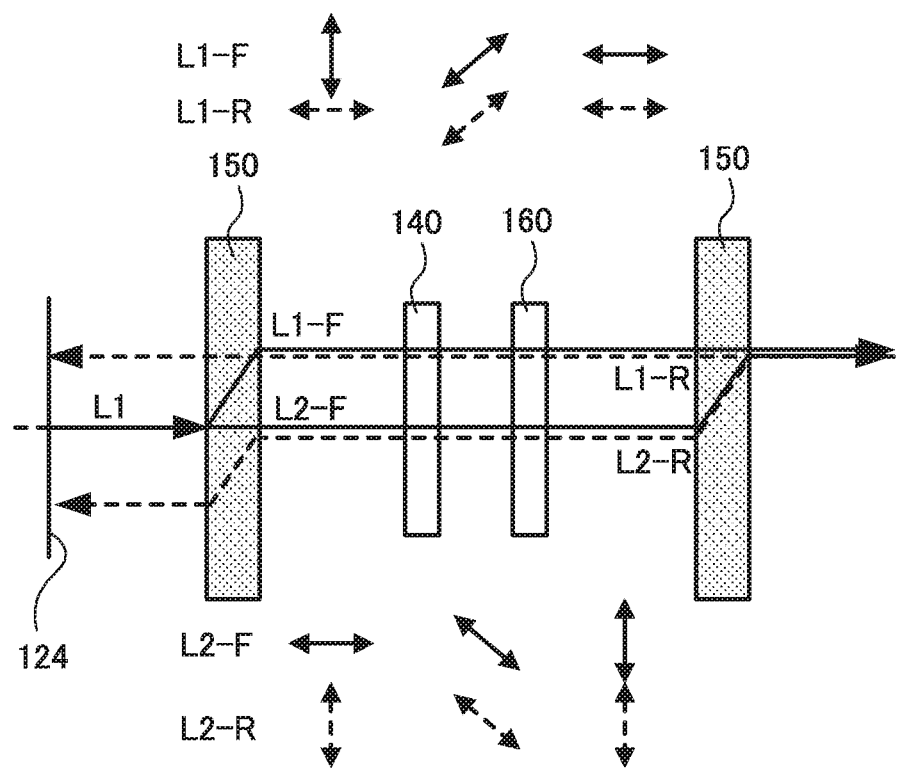
FIGS. 10A and 10B are explanatory diagrams illustrating a modification of a combination of optical devices.
Figure 10B:
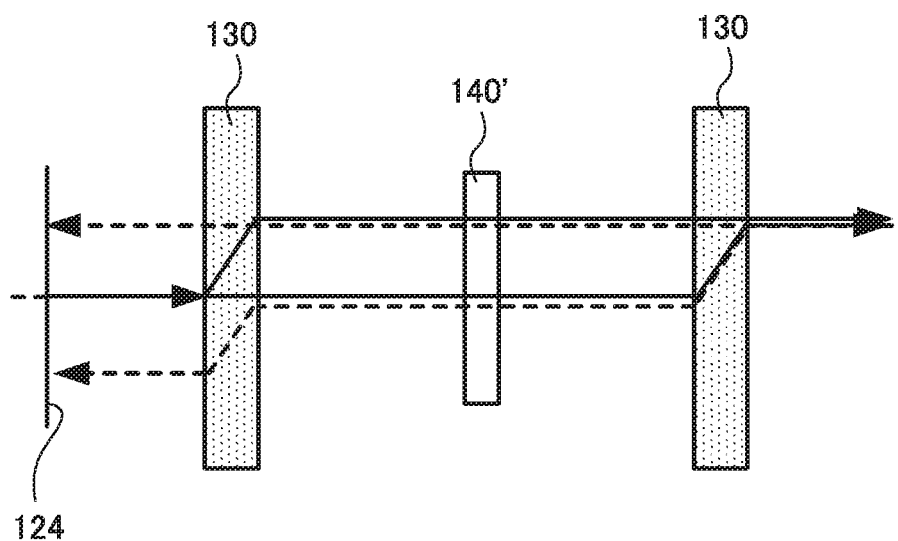
Figure 11:
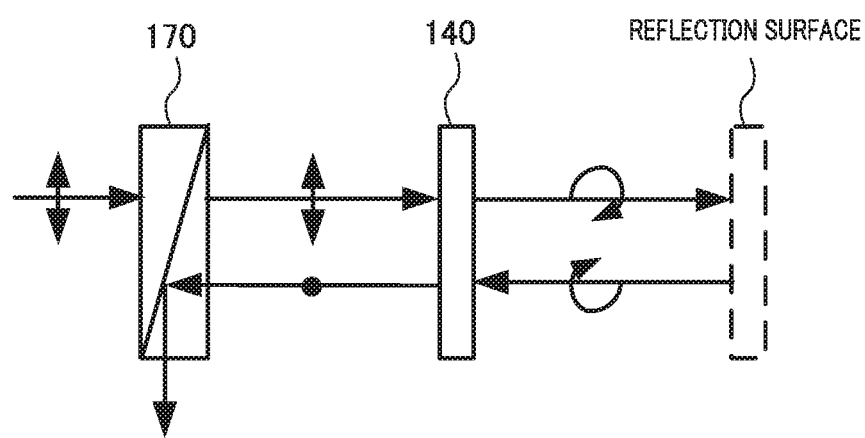
FIG. 11 is an explanatory diagram illustrating a modification of the combination of optical devices.

FIGS. 10A, 10B and 11 are explanatory diagrams illustrating modifications of the combination of optical devices. For example, birefringence plate 150, rotator 140 (Faraday rotator), half-wave plate 160 and birefringence plate 150 may be disposed in this order (see FIG. 10A). In this drawing, the polarization state of the light is indicated by arrows pointing both ways.

For example, in FIG. 10A, vertically polarized light passes through birefringence plate 150 while being refracted (L1-F) and laterally polarized light passes straight through birefringence plate 150 (L2-F). Then, the light beams are rotated at rotator 140 by 45 degrees to the right side with respect to the travelling direction, and thereafter rotated by 45 degrees at half-wave plate 160 to the right side with respect to the travelling direction. As a result, polarized light L1-F and polarized light L2-F become laterally polarized light and vertically polarized light, respectively, and impinge on birefringence plate 150. The L1-F as laterally polarized light passes straight through birefringence plate 150, and the polarized light L2-F as vertically polarized light passes through birefringence plate 150 while being refracted, and they are combined and emitted as a light beam.

On the other hand, when the L1-F as laterally polarized light travels (returns) in the opposite direction, the laterally polarized light passes straight through birefringence plate 150 (L1-R), and the vertically polarized light passes through birefringence plate 150 while being refracted (L2-R). Next, the light beams are rotated at half-wave plate 160 by 45 degrees to the left side with respect to the travelling direction, and then further rotated at rotator 140 by 45 degrees to the right side with respect to the travelling direction. As a result, polarized light L1-R becomes laterally polarized light so as to pass straight through birefringence plate 150 whereas polarized light L2-R becomes vertically polarized light so as to pass through birefringence plate 150 while being refracted. As a result, polarized light beams are emitted from positions different from the incident positions, without passing through lens surface 122 of light isolator member 120A (120).

Alternatively, polarizer 130, Faraday rotator 140' with rotor and polarizer 130 may be provided in this order (see FIG. 10B).

In addition, in the case where a reflection surface is provided on the light path, a configuration that is the same as the configuration illustrated in FIG. 6B except that polarizer 130 is replaced with beam splitter 170 may be adopted (see FIG. 11).

INDUSTRIAL APPLICABILITY

The light isolator according to the embodiment of the present invention is suitable for optical communications using an optical transmission member, for example.

REFERENCE SIGNS LIST

100 Light isolator
110A, 110B Optical transmission member
110a, 110b Connector
120 Light isolator member
120A First light isolator member
120B Second light isolator member
121 First surface
122 Lens surface
123 Second surface
124 Transmission surface
125 Positioning part 126 Fixing part
127 Fitting part (First fitting part)
128 Fitting part (Second fitting part)
130 Polarizer
140 Rotator
140' Faraday rotator with rotor
150 Birefringence plate
160 Half-wave plate
170 Beam splitter
180A, 180B Batch of optical transmission member

What is claimed is:

1. A light isolator member configured to be joined to another light isolator member to serve as a part of a light isolator, the light isolator member comprising:
   a lens surface disposed in a first surface;
   a transmission surface disposed at a position corresponding to the lens surface in a second surface on a side opposite to the first surface; and
   a fitting part disposed in the second surface, the fitting part being configured for fitting to the other light isolator member.

2. The light isolator member according to claim 1, further comprising a positioning part disposed in the first surface and configured to position an optical transmission member with respect to the lens surface.

3. The light isolator member according to claim 2, wherein the lens surface, the transmission surface, the fitting part and the positioning part are integrated with one another.

4. The light isolator member according to claim 1, further comprising a fixing part disposed in the second surface and configured to fix an optical device at the transmission surface.

5. The light isolator member according to claim 1, wherein:
   a plurality of the fitting parts are provided; and
   the plurality of the fitting parts include a first fitting part and a second fitting part, the first fitting part being a recess, the second fitting part being a protrusion.

6. The light isolator member according to claim 5, wherein the first fitting part and the second fitting part have shapes that are complementary to each other.

7. The light isolator member according to claim 6, wherein the plurality of fitting parts are disposed at positions that are symmetric about an optical axis of light that passes through the lens surface and the transmission surface.

8. A light isolator, comprising:
   a first light isolator member;
   a second light isolator member; and
   an optical device disposed between the first light isolator member and the second light isolator member,
   wherein each of the first light isolator member and the second light isolator member is the light isolator member according to claim 1, and
   wherein the fitting part of the first light isolator member and the fitting part of the second light isolator member are fitted with each other.

9. A light isolator, comprising:
   a first light isolator member;
   a second light isolator member; and
   an optical device disposed between the first light isolator member and the second light isolator member,
   wherein each of the first light isolator member and the second light isolator member is the light isolator member according to claim 7, and
   wherein the fitting part of the first light isolator member and the fitting part of the second light isolator member are fitted with each other.

10. The light isolator according to claim 9, wherein the first light isolator member and the second light isolator member have a same shape.

* * * * *